(12) United States Patent
Chen et al.

(10) Patent No.: US 7,898,873 B2
(45) Date of Patent: Mar. 1, 2011

(54) WINDOW ENLARGEMENT BY SELECTIVE ERASE OF NON-VOLATILE MEMORY CELLS

(75) Inventors: Po Chou Chen, Danshui Town, Taipei County (TW); I Chen Yang, Changhua (TW); Hui Chih Lin, Toufen Township, Miaoli County (TW); Yao Wen Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 67 days.

(21) Appl. No.: 12/485,510

(22) Filed: Jun. 16, 2009

(65) Prior Publication Data

US 2010/0149880 A1 Jun. 17, 2010

Related U.S. Application Data

(60) Provisional application No. 61/138,508, filed on Dec. 17, 2008.

(51) Int. Cl.
*G11C 16/00* (2006.01)

(52) U.S. Cl. .......................... 365/185.29; 365/185.02; 365/185.24

(58) Field of Classification Search ............. 365/185.02
See application file for complete search history.

(56) References Cited

U.S. PATENT DOCUMENTS

| | | | |
|---|---|---|---|
| 6,269,023 B1 * | 7/2001 | Derhacobian et al. | 365/185.24 |
| 6,442,074 B1 * | 8/2002 | Hamilton et al. | 365/185.29 |
| 6,456,531 B1 * | 9/2002 | Wang et al. | 365/185.18 |
| 6,963,508 B1 * | 11/2005 | Shone | 365/185.28 |
| 7,486,567 B2 * | 2/2009 | Wu | 365/185.28 |
| 2005/0013173 A1 | 1/2005 | Prinz et al. | |

* cited by examiner

*Primary Examiner*—Tan T. Nguyen
(74) *Attorney, Agent, or Firm*—Stout, Uxa, Buyan & Mullins, LLP (57) ABSTRACT

A method is described for enlarging a programming window of charge trapping memory cells in a virtual ground charge trapping memory EEPROM array. The method substantially eliminates second bit effects and program disturbances to nearby charge trapping memory cells.

23 Claims, 10 Drawing Sheets

WINDOW ENLARGEMENT BY SELECTIVE ERASE OF NON-VOLATILE MEMORY CELLS

CROSS-REFERENCE TO RELATED APPLICATIONS

This application claims the benefit of U.S. Provisional Application No. 61/138,508, filed Dec. 17, 2008 and entitled WINDOW ENLARGEMENT BY SELECTIVE ERASE OF NON-VOLATILE MEMORY CELLS, the entire contents of which are incorporated herein by reference.

BACKGROUND OF THE INVENTION

1. Field of the Invention

The present invention relates generally to methods of operating semiconductor memory cells and, more particularly, to a method for programming nitride read only memory cells.

2. Description of Related Art

A non-volatile semiconductor memory device is designed to maintain programmed information even in the absence of electrical power. Read only memory (ROM) is a non-volatile memory commonly used in electronic equipment such as microprocessor-based digital electronic equipment and portable electronic devices.

ROM devices typically include multiple memory cell arrays. Each memory cell array may be visualized as including intersecting word lines and bit lines. Each word and bit line (or bit line pair) intersection can correspond to one bit of memory. In mask programmable metal oxide semiconductor (MOS) ROM devices, the presence or absence of an active MOS transistor at word and bit line intersections distinguishes between a stored logic '0' and logic '1'.

A programmable read only memory (PROM) is similar to the mask programmable ROM except that a user may store data values (i.e., program the PROM) using a PROM programmer. A PROM device is typically manufactured with fusible links at all word and bit line intersections. This corresponds to having all bits at a particular logic value, typically logic '1'. The PROM programmer is used to set desired bits to the opposite logic value, typically by applying a high voltage that vaporizes the fusible links corresponding to the desired bits. A typical PROM device can be programmed only once.

An erasable programmable read only memory (EPROM) is programmable like a PROM, but can also be erased (e.g., to an all logic '1's state) by exposing it to ultraviolet light. A typical EPROM device has a floating gate MOS transistor at word and bit line intersections. Each MOS transistor has two gates: a floating gate and a non-floating or control gate. The floating gate is not electrically connected to any conductor, and is surrounded by a high impedance insulating material. To program the EPROM device, a high voltage is applied to the non-floating gate at each bit location where a logic value (e.g., a logic '0') is to be stored. This causes a breakdown in the insulating material and allows a negative charge to accumulate on the floating gate. When the high voltage is removed, the negative charge remains on the floating gate. During subsequent read operations, the negative charge prevents the MOS transistor from forming a low resistance channel between a drain bit line and a source bit line (i.e., from turning on) when the transistor is selected.

An EPROM integrated circuit is normally housed in a package having a quartz lid, and the EPROM is erased by exposing the EPROM integrated circuit to ultraviolet light passed through the quartz lid. The insulating material surrounding the floating gates becomes slightly conductive when exposed to the ultraviolet light, allowing the accumulated negative charges on the floating gates to dissipate.

A typical electrically erasable programmable read only memory (EEPROM) device is similar to an EPROM device except that individual stored bits may be erased electrically. The floating gates in an EEPROM device are surrounded by a much thinner insulating layer, and accumulated negative charges on the floating gates can be dissipated by applying a voltage having a polarity opposite that of the programming voltage to the non-floating gates.

Localized trapped charge devices may also be employed as non-volatile memory cells and may be referred to as charge trapping memory devices.

Charge trapping memory devices are known that can store multiple bits per cell. According to a typical implementation, charge can be stored in two regions of a nitride layer that forms part of a typical charge trapping memory cell. Further, a multiple-bit charge trapping memory cell may be formed of a single transistor, leading to densities of charge trapping memory arrays that are higher than those achieved by many floating gate memories.

Programming a charge trapping memory device may be complicated by several undesirable effects that conspire to impair an ability to determine a program state of a region of the charge trapping memory device. These undesirable effects, which may include program disturbance and a second bit effect, can effectively reduce a programming window associated with operation of the charge trapping memory device.

A need thus exists in the prior art for a method of programming charge trapping memory cells that mitigates undesirable effects, such as program disturbance and the second bit effect, on the programming of the charge trapping memory devices.

SUMMARY OF THE INVENTION

The present invention discloses a two-stage method of programming a virtual ground array of charge trapping memory cells. An embodiment of the array comprises a plurality of rows of charge trapping memory cells. One implementation of the method comprises identifying a first charge trapping memory cell, which may have first and second data regions, in an identified row of the array. The implementation further comprises receiving a first programming instruction according to the first and second data regions in the first charge trapping memory cell. The first data region in the first charge trapping memory cell is programmed when the first programming instruction dictates programming of the first data region in the first charge trapping memory cell. The method also includes a step of erasing the second data region in the first charge trapping memory cell when the first programming instruction dictates programming of the first data region in the first charge trapping memory cell and when the first programming instruction does not dictate programming of the second data region in the first charge trapping memory cell.

Another implementation of the method further comprises identifying a second charge trapping memory cell in the identified row of the array, the second charge trapping memory cell having a first data region, wherein the first data region of the second charge trapping memory cell shares a bitline with the second data region of the first charge trapping memory cell. This implementation also comprises programming the second data region in the first charge trapping memory cell when the first programming instruction dictates programming of the second data region in the first charge trapping memory cell. The implementation further comprises erasing the first data region in the second charge trapping memory cell when the first programming instruction dictates programming of the second data region in the first charge trapping memory cell and when the second programming instruction does not dictate programming of the first data region in the second charge trapping memory cell.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not provide a complete description of a method of programming charge trapping memory cells. The present invention may be practiced in conjunction with various methods of operation that are conventionally used in the art, and only so much of the commonly practiced method steps are included herein as are necessary to provide an understanding of the present invention. The present invention has applicability in the field of semiconductor memory devices and operating methods in general. For illustrative purposes, however, the following description pertains to methods of programming an array of charge trapping memory cells.

Figure 1A:
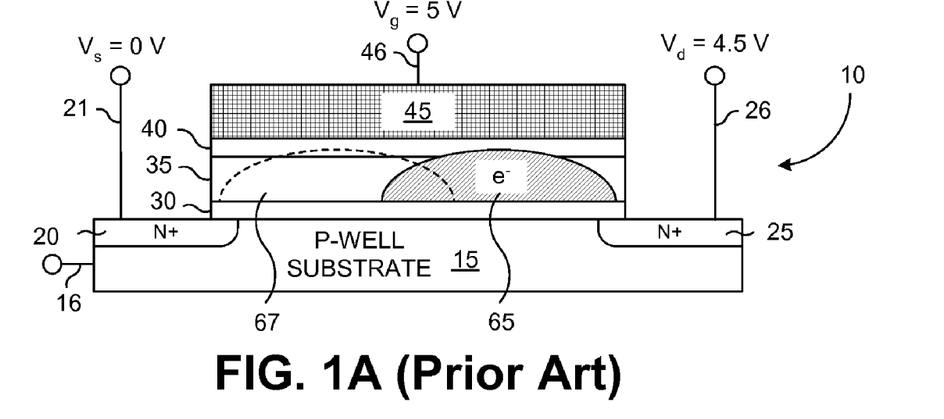
FIG. 1A is a cross-sectional diagram illustrating an effect of a prior-art method of programming a data region of a charge trapping memory cell.

Referring more particularly to the drawings, FIG. 1A is a cross-sectional diagram of a conventional charge trapping memory cell 10 which is disposed in a semiconductor substrate 15 of lightly doped p-type silicon forming a P-well and which comprises source 20 and drain 25 regions of heavily doped n-type material formed in the substrate. A channel may form in the substrate 15 between the source 20 and drain 25 regions. A first isolating layer 30 overlies the channel, and a charge trapping layer 35, which may be referred to as a charge storage structure, overlies the first isolating layer 30. The charge trapping layer 35 is formed of silicon nitride. A second isolating layer 40 overlies the charge trapping layer 35, and a conducting gate 45 overlies the second isolating layer 40. The first and second isolating layers 30 and 40 are formed of silicon dioxide, and the gate 45 is formed of polysilicon. The first isolating layer 30 has a thickness of about 40 angstroms (Å), the charge trapping layer 35 has a thickness of about 70 Å and a thickness of the second isolating layer 40 is about 90 Å.

Terminals are provided that allow external voltages to be applied to the drain 25, source 20, gate 45, and substrate 15. That is, a drain terminal 26 is connected to the drain 25, a source terminal 21 is connected to the source 20, a gate terminal 46 is connected to the gate 45 and a substrate terminal 16 is connected to the substrate 15.

Figure 1B:
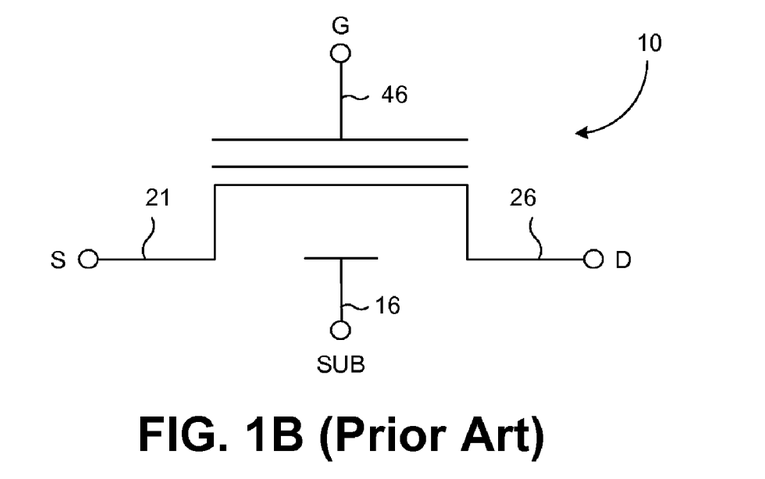
FIG. 1B is a schematic representation of the charge trapping memory cell illustrated in FIG. 1A.

FIG. 1B is a schematic representation of the charge trapping memory cell 10 illustrated in FIG. 1A wherein source terminal 21, drain terminal 26, gate terminal 46, and substrate terminal 16 schematically represent corresponding terminals of FIG. 1A.

An unprogrammed charge trapping memory cell, such as the device illustrated in FIG. 1A, can be biased with a positive supply voltage, e.g. about 4.5 V, applied from drain terminal 26 to source terminal 21 with the source terminal 21 connected to the substrate terminal 16. Under this bias condition, applying a voltage to the gate terminal 46 that is positive with respect to the source terminal 21 normally results in a current (i.e., a drain current) that can be measured in an external circuit connected to the drain terminal 26. That is, when the voltage applied between the gate terminal 46 and the source terminal 21 (i.e., a gate-to-source voltage) exceeds a level referred to as a threshold potential, $V_t$, a measurable drain current can be observed. Typically, $V_t$ can have a value approximating 2 volts, and a measurable drain current ranging, for example, from about 1 μA to 15 μA can result when the gate-to-source voltage exceeds the threshold potential, $V_t$.

Programming a charge trapping memory cell can take a form of altering the threshold potential, $V_t$, of the charge trapping memory cell. One way to alter the $V_t$ of a charge trapping memory cell is to inject a charge having a first polarity into a portion of the charge trapping layer 35. According to one instance, a negative charge is injected. The amount of charge injected can be chosen to modify the $V_t$ of the cell by a desired amount. For example, an amount of charge can be injected that is sufficient to raise the threshold potential of a charge trapping memory cell to a level of, for example, about 4 V, in which case the charge trapping memory cell may be said to be programmed.

Figure 2:
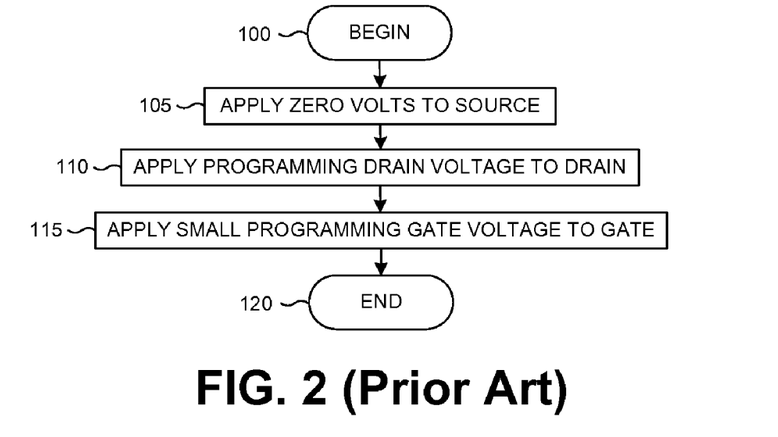
FIG. 2 is a flow diagram showing prior-art programming of a data region of a charge trapping memory cell.

One known method for programming a charge trapping memory cell is illustrated in FIG. 2. With continuing reference to FIG. 1A, the method of FIG. 2, which may be referred to as channel hot electron (CHE) programming, begins at step 100 and continues at step 105 by applying zero volts to the source terminal 21. (All applied voltages are referenced to the potential of the substrate terminal 16, which may be connected, for example, to earth ground.) A programming drain voltage (e.g., about 4.5 V) may be applied to the drain terminal 26 at step 110, and a relatively small programming gate voltage (e.g., about 5 V) may be applied to the gate terminal at step 115 with the method terminating at step 120. The voltages just described in the method may establish an electric field (directed generally from right to left, but having a vertical component as well) in a channel (not identified in FIG. 1A) that forms in the substrate 15 between the source 20 and the drain 25. Under the specified bias conditions, electrons from the source 20 may be accelerated toward the drain 25 under an influence of the electric field. Some of these accelerated electrons may have sufficient kinetic energy to reach and become trapped in the charge trapping layer 35. Such a collection of trapped electrons 65 is illustrated in FIG. 1A. It may be noted that the collection of trapped electrons 65 is distributed rather widely (cf. an alternative collection of trapped electrons 66 shown in FIG. 3).

A charge trapping memory cell may assume one of at least two program states: programmed and unprogrammed corresponding to one bit of stored information. Methods, which may be referred to as FORWARD READ and REVERSE READ, are known by which a charge trapping memory cell may be interrogated to determine a program state of the charge trapping memory cell. Generally, potentials are applied to the terminals of a cell, and values of resulting currents are compared with current thresholds. Depending upon relative values of the currents and current thresholds, decisions as to a program state of a charge trapping memory cell can be made.

By reversing the roles of the source 20 and drain 25 in FIG. 1A, another collection of trapped electrons 67 may also be injected into the charge trapping layer 35. In this way, the charge trapping memory cell 10 may be used to store two data values, one in a first data region (i.e. trapped electrons 65) and another in a second data region (i.e. trapped electrons 67). That is, each data region may be either programmed or unprogrammed, providing a single charge trapping memory cell able to store two bits of information. However, as illustrated, the two collections of trapped electrons 65 and 67 may overlap, which may limit an ability to determine a program state of left and right data regions in the charge trapping memory cell 10.

Figure 3:
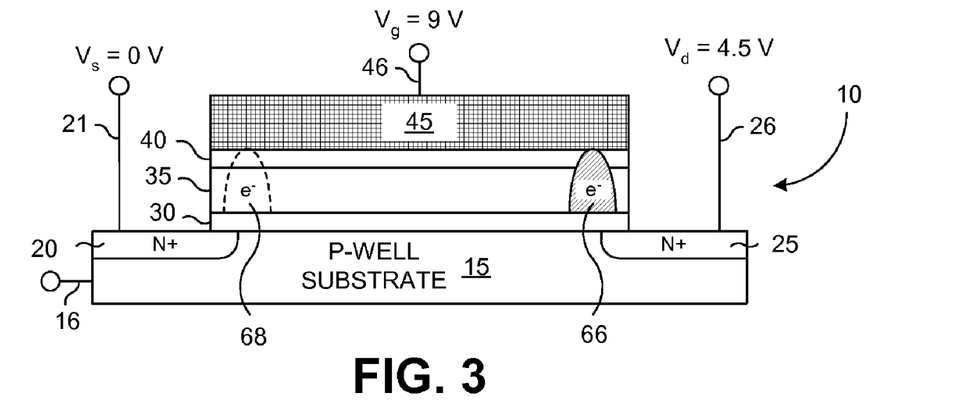
FIG. 3 is a cross-sectional diagram illustrating an effect of programming a data region of a charge trapping memory cell using channel hot electron injection.
Figure 4:
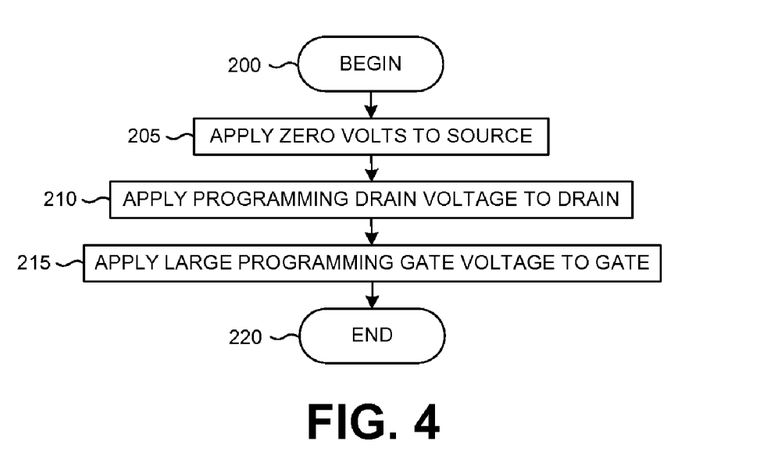
FIG. 4 is a flow diagram of one implementation of a method of programming a data region of a charge trapping memory cell.

One way to overcome the limitation caused by overlap of the second and first data regions (e.g., respectively, left and right data regions) in FIG. 1A is to employ a modified CHE programming method illustrated in FIG. 4. The illustrated method, which may apply to an embodiment illustrated in FIG. 3, comprises beginning at step 200 and, as before, applying zero volts to the source terminal 21 at step 205. A programming drain voltage (e.g., about 4.5 V) is also applied to the drain terminal 26 at step 210. At step 215, a relatively large programming gate voltage (e.g., about 9 volts) is applied to the gate terminal 46. The relatively larger programming gate voltage may act to strengthen the vertical component of the electric field described above with reference to FIG. 1A. As a result, a larger concentration of electrons may be generated near the source 25 of the charge trapping memory cell 10. These electrons may be accelerated toward the gate 45 under the influence of a now-larger vertical component of electric field therefore resulting in a relatively narrowly distributed collection of trapped electrons 66 in the right data region of the charge trapping layer 35. When roles of source and drain shown in FIG. 3 are reversed, and the method of FIG. 4 is applied, another relatively narrowly distributed collection of trapped electrons 68 may be injected into the left data region of the charge trapping layer 35. The electron distributions in the left and right data regions may have substantially no overlap, thereby improving an ability to determine program states of the left and right data regions using known methods.

Figure 5:
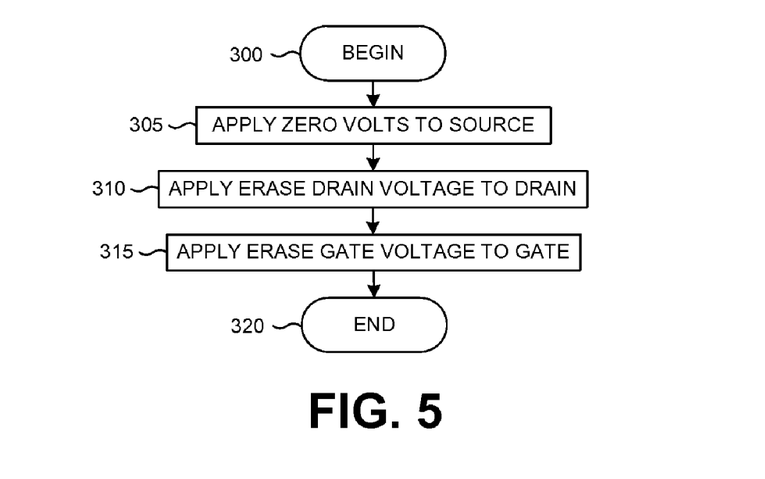
FIG. 5 is a flow diagram of one implementation of a method of erasing a data region of a charge trapping memory cell.
Figure 6:
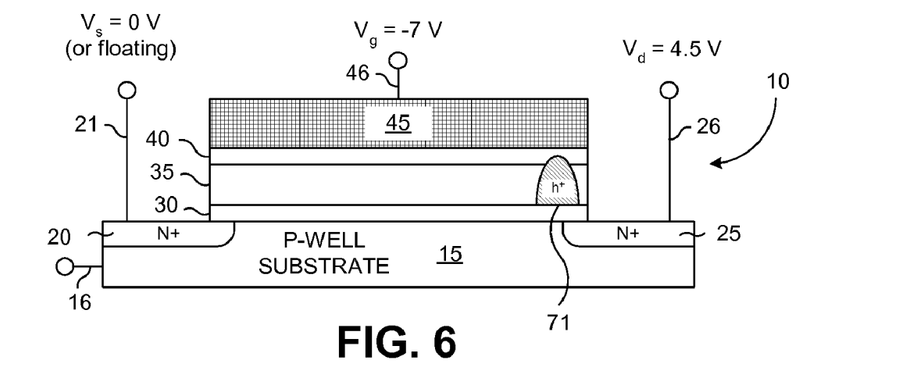
FIG. 6 is a cross-sectional diagram illustrating an effect of erasing a data region of a charge trapping memory cell using band-to-band hot hole injection.

As already described, a data region of a charge trapping memory cell may be considered to be in one of at least two states. In a binary situation, the data region may be either programmed or unprogrammed. An unprogrammed data region may also be referred to as "erased." One method for erasing a data region in a charge trapping memory cell is to inject a charge having a second polarity, which may be opposite the first polarity, into the data region. One particular method, which may be termed a band-to-band hot hole (BBHH) method, is described in FIG. 5. Referring also to FIG. 6, the method commences at step 300 and continues by applying zero volts to the source terminal 21 at step 310. Alternatively, the source terminal 21 may be left floating. An erase drain voltage (e.g., about 4.5 V) may be applied to the drain terminal 26 at step 310, and an erase gate voltage (e.g., about −7 V) may be applied to the gate terminal 46 at step 315. The method terminates at step 320. The specified bias conditions effectively back-bias a p-n junction that exists at an interface between the p-type substrate 15 and the n-type drain 25. Hole-electron pairs generated within the depletion region result in electrons that are swept to the source as well as holes that are swept into the p-type substrate 15 under an effect of an electric field associated with the depletion region. The bias conditions, further, establish an electric field having vertical and lateral components in a channel that may form in the substrate 15 between the drain 25 and the source 20. The lateral component of the electric field may accelerate holes toward the source 20. Some of these holes may have sufficient kinetic energy that, when they collide with atoms in the substrate 15, generate other holes, which may be referred to as hot holes, having relatively large kinetic energy with velocity in a vertical direction. These hot holes may be further accelerated by the vertical component of the electric field, which vertical component may be enhanced by the negative voltage on the gate 45. The hot holes may thereby reach the charge trapping layer 35 where they become trapped in the right data region of the charge trapping memory cell 10. FIG. 6 illustrates a collection of trapped holes 71.

If, for example, the right data region had been previously programmed as illustrated in FIG. 3, then the holes produced by the erasing operation just described may recombine with the electrons in the charge trapping layer 35, effectively neutralizing the charge in the right data region, that is, effectively placing the right data region into an erased (or unprogrammed) state. It will be understood that a similar description applies to the left data region when the roles of the source 20 and drain 25 are reversed in the charge trapping memory cell 10.

Figure 7:
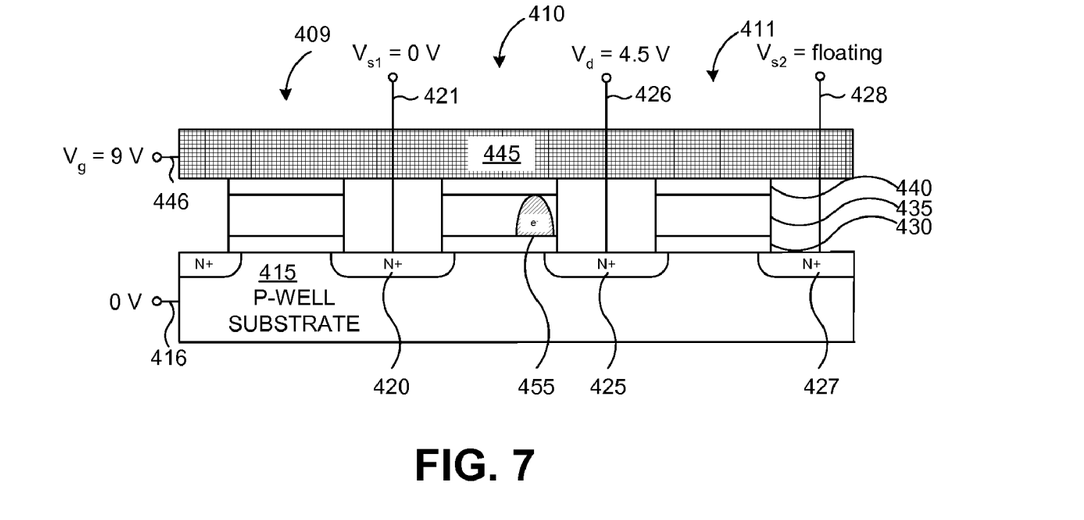
FIG. 7 is a cross-sectional diagram depicting a second bit effect associated with programming a data region of a charge trapping memory cell.

FIG. 7 is a cross-sectional diagram illustrating a second bit effect that may result when a data region (which may be referred to below as a data bit) is programmed in a charge trapping memory cell. The figure shows three charge trapping memory cells 409, 410, and 411, which may represent a portion of a row of charge trapping memory cells that may extend in both directions in FIG. 7. Columns of charge trapping memory cells that extend into the plane of FIG. 7 may also be present, but are not shown in the figure. The embodiment of FIG. 7 includes a gate that connects to all charge trapping memory cells in a row; the gate so formed may be referred to as a wordline 445. The wordline 445 may have a terminal 446 to which a programming/erasing gate voltage may be applied. In a direction orthogonal to that of the wordline 445, source 420 and drain 425 regions may extend in a direction normal to a plane of the figure. Depending upon bias conditions, the source 420 region of charge trapping memory cell 410 may be considered to be either a source or a drain of charge trapping memory cell 409. Similarly, the drain region 425 of charge trapping memory cell 410 may be considered to be either a source or a drain of charge trapping memory cell 411. Terminals may be connected to these source/drain regions to form bitlines that are effectively shared by adjacent charge trapping memory cells. For example, charge trapping memory cells 409 and 410 share bitline 421; charge trapping memory cells 410 and 411 share bitline 426. Any bitline is further shared by pairs of charge trapping memory cells (not shown) in other rows parallel to the row illustrated in FIG. 7.

Figure 8:
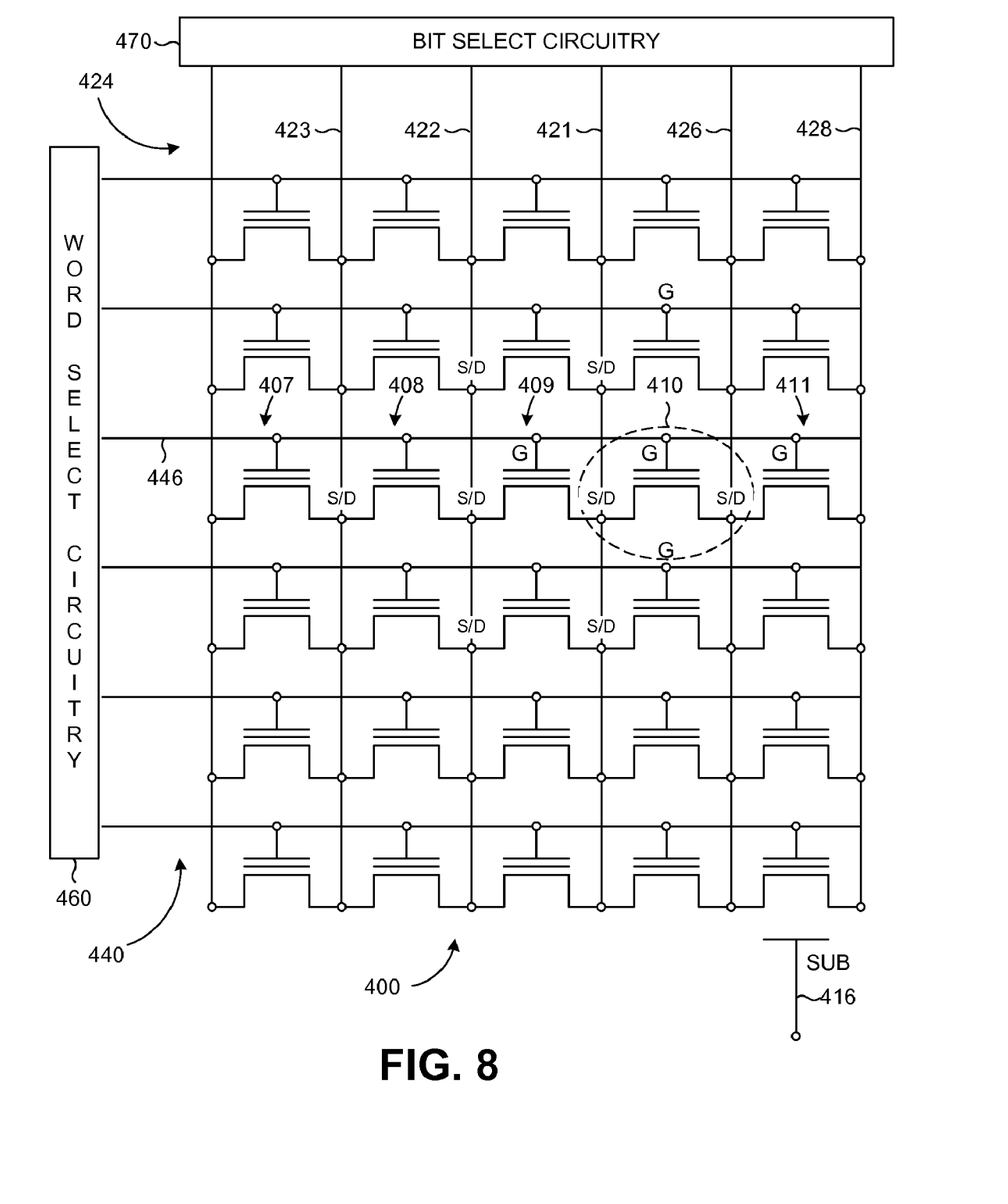
FIG. 8 is a schematic representation of a rectangular array of charge trapping memory cells.

FIG. 8 is a schematic representation of an array 400 of charge trapping memory cells that includes the three charge trapping memory cells 409, 410, and 411 introduced in FIG. 7. The array 400, which has been referred to as a virtual ground NOR-type array, may be formed in a substrate having a substrate terminal 416. Sources and drains of charge trapping memory cells in the array 400 are identified as source/drain (S/D) regions. Bitline 421 connects to source/drain regions of charge trapping memory cells in a column that includes charge trapping memory cells 409 and 410. Similarly, bitline 426 connects to source/drain regions in a column that includes charge trapping memory cells 410 and 411, and bitline 428 connects to source/drain regions in a column that includes charge trapping memory cell 411 and a charge trapping memory cell (not designated in the figure) disposed to the right of charge trapping memory cell 411.

The array 400 illustrated in FIG. 8 includes a collection 424 of bitlines (including bitlines 421, 426, and 428) disposed as described and, further, includes a collection of isolated wordlines 440 (including wordline 446). Word select circuitry 460 may be configured to apply programming/erase voltages to wordlines 440 in any row of the array 400, and bit select circuitry 470 may be configured to apply programming/erase voltages to source/drains in columns of the array 400. In this way, various programming/erase methods (including, for example, those illustrated in FIGS. 2, 4, and 5) may be implemented.

Returning to FIG. 7, the CHE method of FIG. 4 may be used to program a right data region of, for example, charge trapping memory cell 410, which may be disposed between two other charge trapping memory cells 409 and 411. When electrons 455 are injected into the right data region, a surface potential of a portion of the substrate 415 lying within charge trapping memory cell 410 may rise because of the electrons 455. The rise in surface potential may appear as a rise in the $V_t$ of the left data region of charge trapping memory cell 410. This apparent rise may be referred to as a second bit effect.

Although the second bit effect may be small when relatively high values of $V_g$ are applied to terminal 446 (FIG. 7), the second bit effect may become significant in memory cell with relatively small values of length. Raising the $V_t$ of the left data region of charge trapping memory cell 410 reduces a difference between the $V_t$ of an unprogrammed data region and the $V_t$ of a programmed data region. This reduction in difference represents an undesirable reduction in a programming window, which may be referred to herein as an operation window, associated with operation of the charge trapping memory cell 410. It should be noted that effects of a raised surface potential cannot be compensated using a FORWARD READ method of charge trapping memory cell interrogation.

The representation of FIGS. 6 and 7 describes only approximately a shape of a distribution of electrons 455. Generally, the gate 45 (FIG. 6) is quite narrow, and the second bit effect may be determined by a width and height of the injected charge of electrons 455. Employing a relatively large value of $V_g$ when programming tends to generate a higher, but narrower, profile for the distribution of electrons 455. The second bit effect may become more evident as device size is reduced, and the methods described herein may act to substantially eliminate the second bit effect in such situations.

Figure 9:
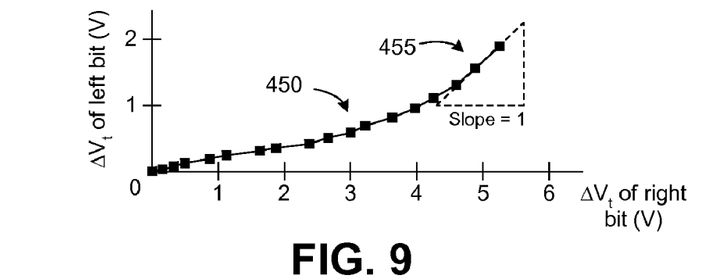
FIG. 9 is a chart illustrating experimental data that quantifies a second bit effect.

FIG. 9 is a chart illustrating experimental data that quantifies the second bit effect more precisely according to one particular embodiment of a charge trapping memory cell. A curve 450 on the chart illustrates an effect of programming a right data region (which may be referred to as a right bit in some instances) of the charge trapping memory cell to a value about 3 volts higher than an initial value (i.e., when $\Delta V_t$ of the right bit is about 3 V). The curve 450 demonstrates that a change of about 0.6 V is observed in the $V_t$ of the left data region (i.e., of the left bit) of the charge trapping memory cell. Stated another way, a difference between a programmed and an unprogrammed data bit is reduced from about 3−0=3 V to about 3−0.6=2.4 V. That is, the programming window of the cell is reduced from about 3 V to about 2.4 V. While one way of increasing the programming window is to program the right data bit to a higher value of $V_t$, say, $\Delta V_t$=5 V, the chart of FIG. 9 shows that doing so increases $\Delta V_t$ of the left bit to about 1.6 V. In fact, at still higher values of $\Delta V_t$ of the right bit a corresponding 1-1 change in the $\Delta V_t$ of the left bit may be observed (cf. Slope=1 region 455 on the chart of FIG. 9), a point of diminishing returns. High programming levels bring other disadvantages that are known to those skilled in the art, so other methods of increasing a programming window may be preferred.

Figure 10A:
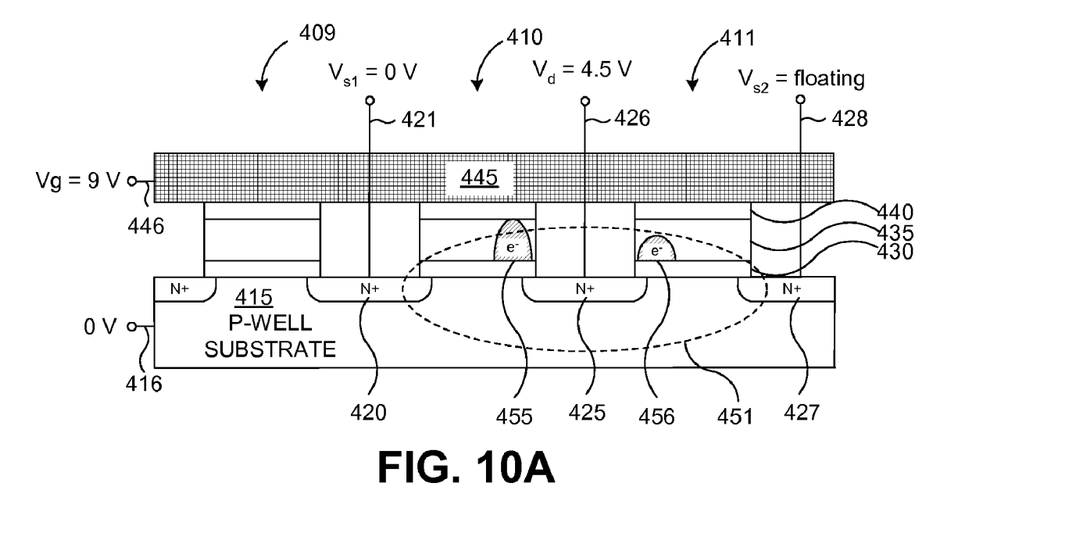
FIG. 10A is a cross-sectional diagram depicting program disturbance associated with programming a data region of a charge trapping memory cell.
Figure 10B:
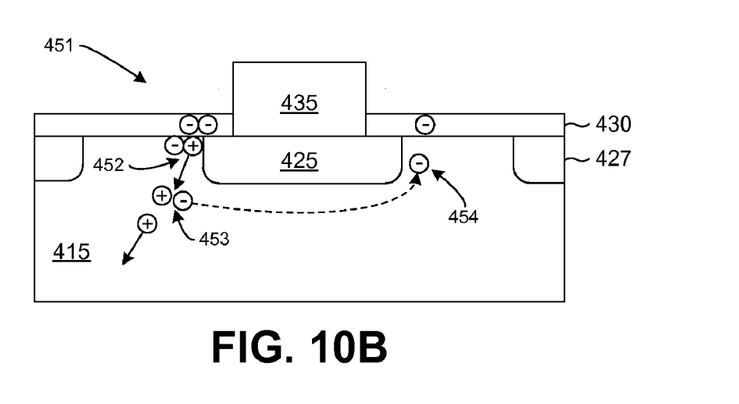
FIG. 10B is a cross-sectional diagram showing detail of a portion of FIG. 10A and illustrating a mechanism of a program disturbance.

Another parasitic effect, which may be referred to as a program disturbance, may result from application of the CHE method of FIG. 4 as illustrated in FIGS. 10A and 10B. The program disturbance may result during CHE programming of, for example, charge trapping memory cell 410. Holes may be generated at a surface of the substrate 415, which holes may lead to secondary ionization within the substrate 415. This secondary ionization, which generates hole-electron pairs, may generate some secondary hot electrons having sufficient kinetic energy to reach and become trapped in the charge trapping layer 435 of charge trapping memory cell 411. These trapped electrons are designated as 456 in FIG. 10A. Again, if the left data region of charge trapping memory cell 411 is NOT to be programmed, then the trapped electrons 456 may effectively raise a $V_t$ of the left data region of charge trapping memory cell 411, thereby undesirably reducing a programming window associated with operation of the charge trapping memory cell 411. FIG. 10B is a cross-sectional diagram showing detail of a portion 451 of FIG. 10A. During CHE programming, holes 452 may be generated by impact ionization at a surface of the substrate 415. The holes tend to migrate into the substrate 415 according to applied bias conditions. Some of the holes may cause secondary impact ionization at a subsurface of the substrate 415, thereby generating additional hole-electron pairs 453 including secondary hot electrons. Some of these secondary hot electrons 454 may arrive at a neighboring cell where they represent a program disturbance.

Figure 11:
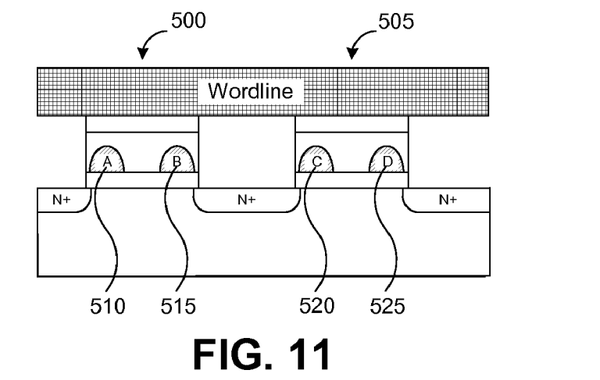
FIG. 11 is a cross-sectional diagram of an example of a pair of adjacent charge trapping memory cells, each cell having two data regions.

FIG. 11 is a cross-sectional diagram of an example of such a pair of cells, 500 and 505, which may be compared to respective charge trapping memory cells 410 and 411 (FIG. 10A). For simplicity, much of the structure of the cells is omitted, but four data regions, identified as bit A 510, bit B 515, bit C 520, and bit D 525, are shown. From the above discussion with regard to FIGS. 7 and 9, it may be understood that programming bit B 515 may raise a $V_t$ of bit A 510 (second bit effect). Further, from the above discussion relative to FIG. 10A, it may be understood that programming bit B 515 may raise a $V_t$ of bit C 520 (program disturbance).

Figure 12:
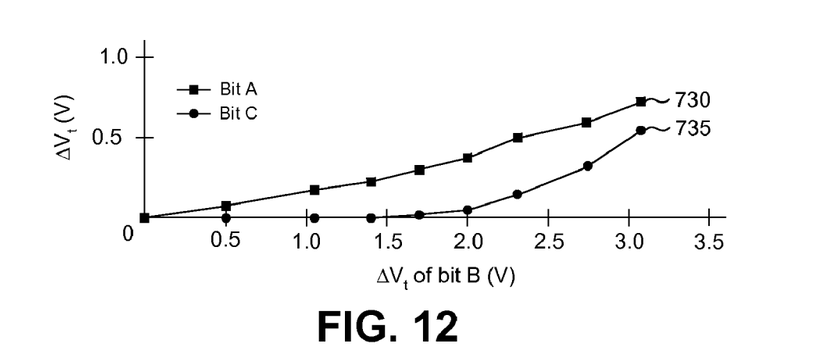
FIG. 12 is a chart of experimental data illustrating second bit and program disturbance effects among data bits of adjacent charge trapping memory cells.

FIG. 12 is a chart of experimental data that illustrates the second bit and program disturbance effects among data bits of adjacent charge trapping memory cells, e.g., bits A-D 510, 515, 520 and 525 of charge trapping memory cells 500 and 505 (FIG. 11) in one particular embodiment of a collection of charge trapping memory cells. The chart presents changes in the $V_t$ of bits not being programmed (e.g., bit A 510 and bit C 520) that result from programming another bit (e.g., bit B 515). It may be noted from a first curve 730 on the chart that bit A 510 is most affected by programming bit B 515. The $V_t$ of bit A 510 changes by more than 0.75 V when the $V_t$ of bit B 515 is programmed to slightly more than 3 V, a consequence of the second bit effect. The $V_t$ of bit C 520, the bit that shares a bitline with bit B 515, changes by more than 0.5 V under the same conditions, an example of a programming disturbance illustrated by a second curve 735.

One way of mitigating the undesirable second bit and program disturbance effects described above is to perform an erase operation on the data regions affected by the parasitic effects described when the affected data regions are to remain unprogrammed. For example, the BBHH erasing method of FIG. 5 may be applied to the left data region of charge trapping memory cell 410 (FIG. 7) in order to neutralize the electrons 450 that were parasitically introduced into the left data region of charge trapping memory cell 410. Similarly, referring to FIG. 10A, the BBHH erasing method may also be applied to the left data region of charge trapping memory cell 411, thereby neutralizing parasitically introduced electrons 456 that may result from programming a right data region of charge trapping memory cell 410.

Figure 13:
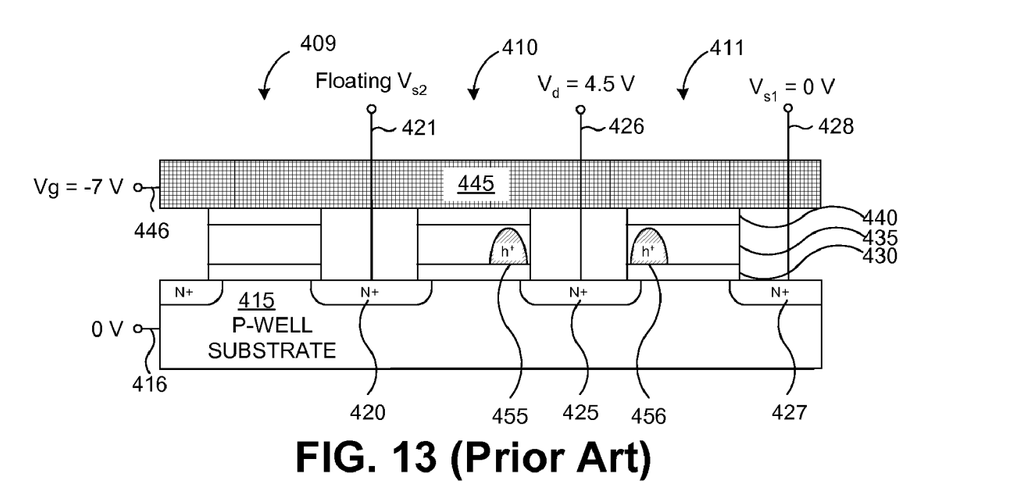
FIG. 13 is a cross-sectional diagram depicting a prior-art erase that can affect data regions in charge trapping memory cells which share a bitline.

Unfortunately, BBHH erasing also introduces parasitic effects that may undesirably affect operation of charge trapping memory cells. One parasitic effect is illustrated in FIG. 13 where the BBHH method of FIG. 5 is applied to inject holes 456 into the left data region of charge trapping memory cell 411. Because of approximate symmetry of bias conditions, injecting holes 456 into the left data region of charge trapping memory cell 411 also may inject holes 455 into the right data region of charge trapping memory cell 410. If the right data region of charge trapping memory cell 410 is to be programmed, then the injecting of holes 455 into the right data region of charge trapping memory cell 410 may modify the $V_t$ of the right data region of charge trapping memory cell 410, thereby undesirably reducing a programming window associated with charge trapping memory cell 410.

Figure 14:
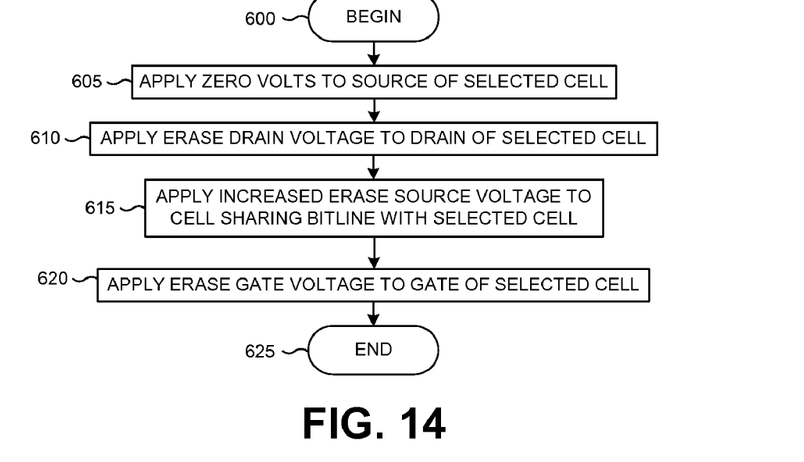
FIG. 14 is a flow diagram illustrating a selective erase operation.
Figure 15:
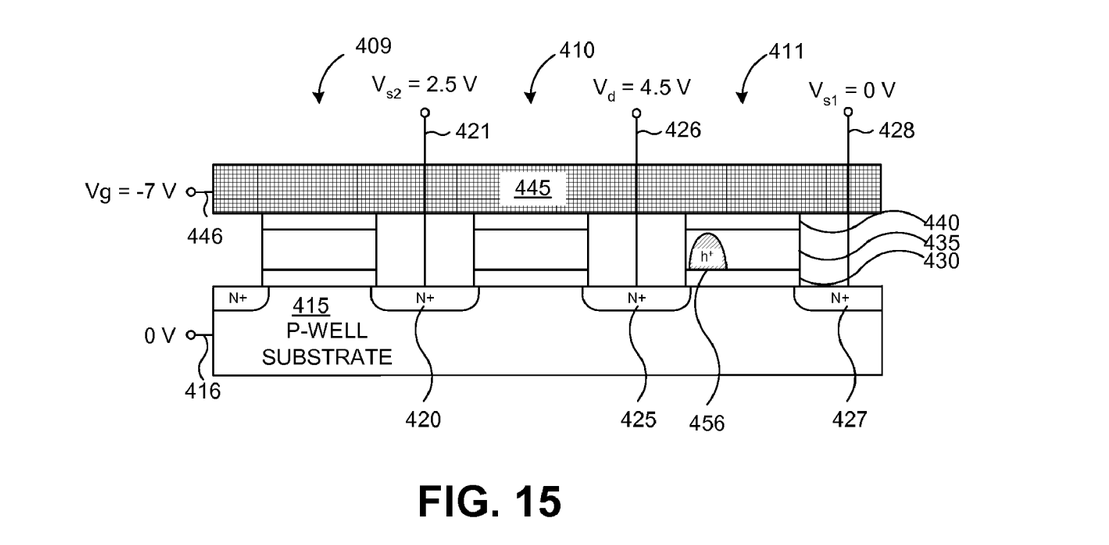
FIG. 15 is a cross-sectional diagram illustrating a selective erase of a data region of a charge trapping memory cell.

The undesirable effects of BBHH erasing illustrated in FIG. 13 may be mitigated by modifying BBHH erasing to create a method of selective erasing, an implementation of which is described in FIG. 14 with reference to FIG. 15. The implementation, which may apply to selectively erasing a data region of a selected charge trapping memory cell, e.g., the left data region of charge trapping memory cell 411, may begin with step 600. The implementation continues at step 605 by applying zero volts to the source (e.g., bitline 428) of the selected cell where a potential of the substrate (e.g., substrate 415) of the charge trapping memory cell (e.g., charge trapping memory cell 411) is used as a voltage reference. An erase drain voltage (e.g., about 4.5 V) is applied to the drain (e.g., bitline 426) of the selected charge trapping memory cell 411. At step 615, an increased erase source voltage (e.g., about 2.5 V) is applied to the source (i.e., bitline 421) of an adjacent charge trapping memory cell (e.g., charge trapping memory cell 410) the drain (i.e., bitline 426) of which is shared with the selected charge trapping memory cell 411. An erase gate voltage (e.g., about −7 V) is applied to the gate of the selected cell (e.g., wordline 445 having terminal 446) at step 620, and the method terminates at step 625. The bias conditions illustrated in FIG. 15 may be sufficient to cause hot holes 456 to be injected into the left data region of the selected charge trapping memory cell 411. Applying the increased erase source voltage to the source (i.e., bitline 421) of the adjacent charge trapping memory cell 410 may have an effect of reducing a magnitude of the electric field that is established in the channel between source 420 and drain 425 of the adjacent charge trapping memory cell 410. Accordingly, kinetic energy of otherwise "hot" holes generated using conventional BBHH erasing methods may be reduced, and therefore substantially no holes are injected into the right data region of the adjacent charge trapping memory cell (charge trapping memory cell 410 in the present instance). To summarize, selective erasing may provide a method of erasing a single left or right data region without substantially affecting a program state of an adjacent charge trapping memory cell. Stated alternatively, selective erasing may provide a method of erasing a data region of a charge trapping memory cell in an identified row of the array without affecting a program state of an adjacent charge trapping memory cell in the same row, the two charge trapping memory cells having data regions that share a bitline.

More generally, bias voltages may be applied to additional nearby bitlines (i.e., bitlines lying left of bitline 421 and not shown in FIG. 15) to further reduce a possibility of unwanted holes being injected into nearby charge trapping memory cells. A difference between adjacent bitline voltages may range from zero to about 2 V. As a specific example, the array 400 of FIG. 8 may be referenced to consider, in addition to charge trapping memory cells 409, 410, and 411, nearby charge trapping memory cells 408 and 407. Charge trapping memory cell 408 shares a bitline 422 with charge trapping memory cell 409; charge trapping memory cell 407 shares a bitline 423 with charge trapping memory cell 408. In addition to the bias voltages already mentioned, bias voltages may be applied to bitlines 422 and 423 when performing a selective erase on the left data region of charge trapping memory cell 411. These bias voltages may be chosen so that a difference of potentials between, for example, bitlines 422 and 423 and between bitlines 422 and 421 ranges from about zero to about 2 V in order to assure that holes are not injected into data regions of charge trapping memory cells 410, 409, 408 and 407.

According to another example, in order to perform a selective erase on the left data region of charge trapping memory cell 411, an erase gate voltage may be applied to wordline 446 that may range from about −3 V to about −10 V with a preferred range being about −3 V to about −7 V. (The lower range may act to prevent occurrence of Fowler-Nordheim tunneling, which could interfere with the erase operation.) Additionally, zero volts may be applied to bitline 428, and a voltage ranging from about 3.5 V to about 5.5 V may be applied to bitline 426. (An upper limit to the voltage applied to bitline 428 may be determined by a breakdown voltage of the device. In one embodiment, a range of 4.5 to 5 V may be preferred.) A voltage that ranges from about 0 to 2 V less than the voltage on bitline 428 may be applied to bitline 421, e.g., about 0.5 V. Voltages on bitlines 422 and 423 may be about 4.5 V and 4.0 V, respectively, and voltages on additional bitlines lying left of bitline 423 may decrease by about 0.5 V with each successive bitline so that the next two bitlines may have voltages of about 3.5 V and 3.0 V applied. That is, voltages that descend in value, as described, from bitline to bitline while moving away from bitline 421 may not result in injection of BBHH into data regions of charge trapping memory cells different from the cell being selectively erased. Working down to a voltage of about 3.0 V may normally be sufficient to avoid BBHH injection into any unintended cell.

Figure 16:
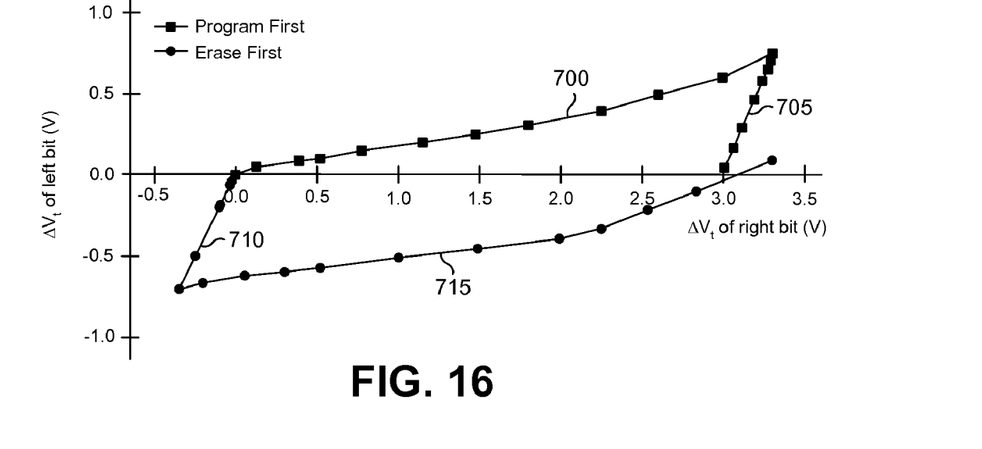
FIG. 16 is a chart illustrating use of a selective erase operation to mitigate the second bit effect on a left bit of a charge trapping memory cell when programming a right bit of the same charge trapping memory cell.

FIG. 16 is a chart that illustrates that the second bit effect on a left bit (e.g., bit A 510 in FIG. 11) of a charge trapping memory cell when programming a right bit (e.g., bit B 515 in FIG. 11) of the same charge trapping memory cell may be mitigated by using a selective erase operation as described above with reference to FIG. 14. The chart depicts effects of a two-stage procedure for programming a first bit (e.g., a right bit) of a charge trapping memory cell when a second bit (e.g., a left bit) of the charge trapping memory cell is to remain unprogrammed. In a first stage, designated as 700 on the chart, the right bit is programmed to a level of about 3.3 V. As shown, the $V_t$ of the left bit (undesirably) increases by about 0.6 V during the programming of the right bit. In a second stage, designated as 705 on the chart, a selective erase is performed on the left bit, which operation substantially eliminates the second bit effect on the left bit and which reduces the $V_t$ of the right bit to about 3.0 V.

In fact, the order of the just described two-stage programming procedure can be reversed to some advantage as, likewise, is illustrated in the chart of FIG. 16. That is, the erase operation (which may or may not be a selective erase) may be performed in a first stage, designated as 710 on the chart, and the right bit can subsequently, in a second stage designated as 715 on the chart, be programmed to a level of about 3.3 V, thereby, again, substantially eliminating the second bit effect.

Figure 17A:
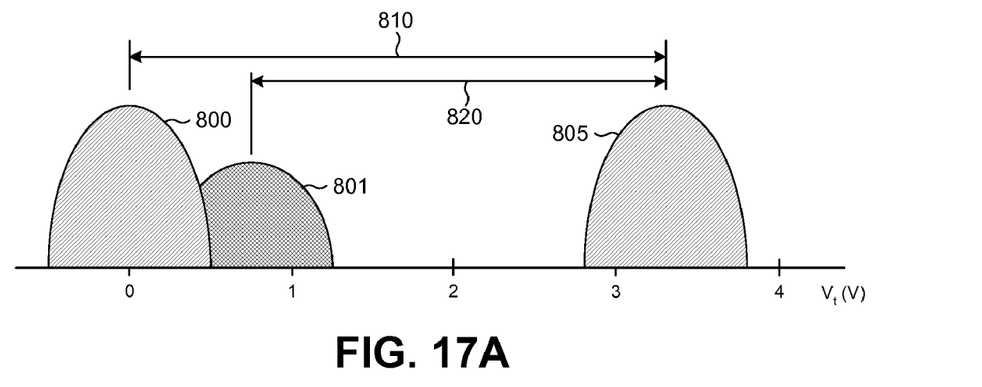
FIGS. 17A and 17B are diagrams depicting an alternative view of the two-stage programming procedure illustrated in FIG. 16.
Figure 17B:
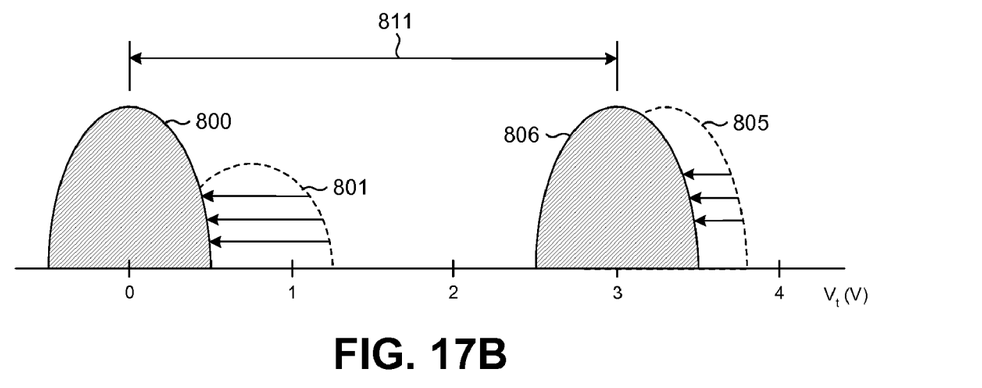

FIGS. 17A and 17B are diagrams illustrating an alternative description of the two-stage programming procedure illustrated in FIG. 16. FIG. 17A shows two $V_t$ distributions: an unprogrammed $V_t$ distribution 800 and a programmed $V_t$ distribution 805 where, for example, an unprogrammed $V_t$ level is selected as about zero V, and a programmed $V_t$ level is selected to be about 3.3 V. After programming, the $V_t$ level of the unprogrammed bit may shift to a level of about 0.75 V, represented in FIG. 17A by a parasitic $V_t$ distribution 801. A programming window of the cell may thereby be reduced from about 3.3–0 or 3.3 V (designated as 810 in FIG. 17A) to about 3.3–0.75 or 2.55 V (designated as 820 in the figure).

Selective erasing, as described herein, may have an effect illustrated in FIG. 17B, whereby the parasitic $V_t$ distribution 801 is substantially eliminated, thereby restoring the unprogrammed $V_t$ level 800 to substantially zero while slightly reducing the programmed $V_t$ level 805 to a programmed $V_t$ level 806 of about 3 V. The resulting programming window 811 is thereby improved from about 2.55 V to about 3–0 or 3 V.

With the tools of CHE programming and selective BBHH erasing at hand, as described above with reference to, respectively, FIG. 4 and FIG. 14, a method of programming an entire array of charge trapping memory cells becomes possible. Although several implementations will be apparent to one skilled in the art in view of this disclosure, one particular implementation is described as a flow diagram in FIG. 18. The implementation may apply to one row of, for example, a virtual ground NOR-type array as illustrated in FIG. 8. The implementation begins at step 900 after a collection of programming instructions for each row of the array is received, and a row of the array is selected. As one example, a row of charge trapping memory cells that share the wordline 446 (FIG. 8) may be selected. The programming instructions, which are not detailed herein, specify whether each bit in each row is to be programmed. Likewise, a method of row selection is not described, as the selection can be performed in a known manner by one skilled in the art. The method continues by initializing a cell index CI to one at step 905. CI thus may point to an identified cell (initially a left-most cell) in the selected row of the array. At step 910, a decision is made as to whether the programming instructions specify that a left bit of the identified cell (e.g., charge trapping memory cell 409 in FIG. 8) is to be programmed. If the left bit is not to be programmed, then the method continues at step 915 where a decision is made as to whether a right bit of the identified cell is to be programmed. If the right bit of the identified cell is not to be programmed, then the method continues at step 960 as described below.

Figure 18:
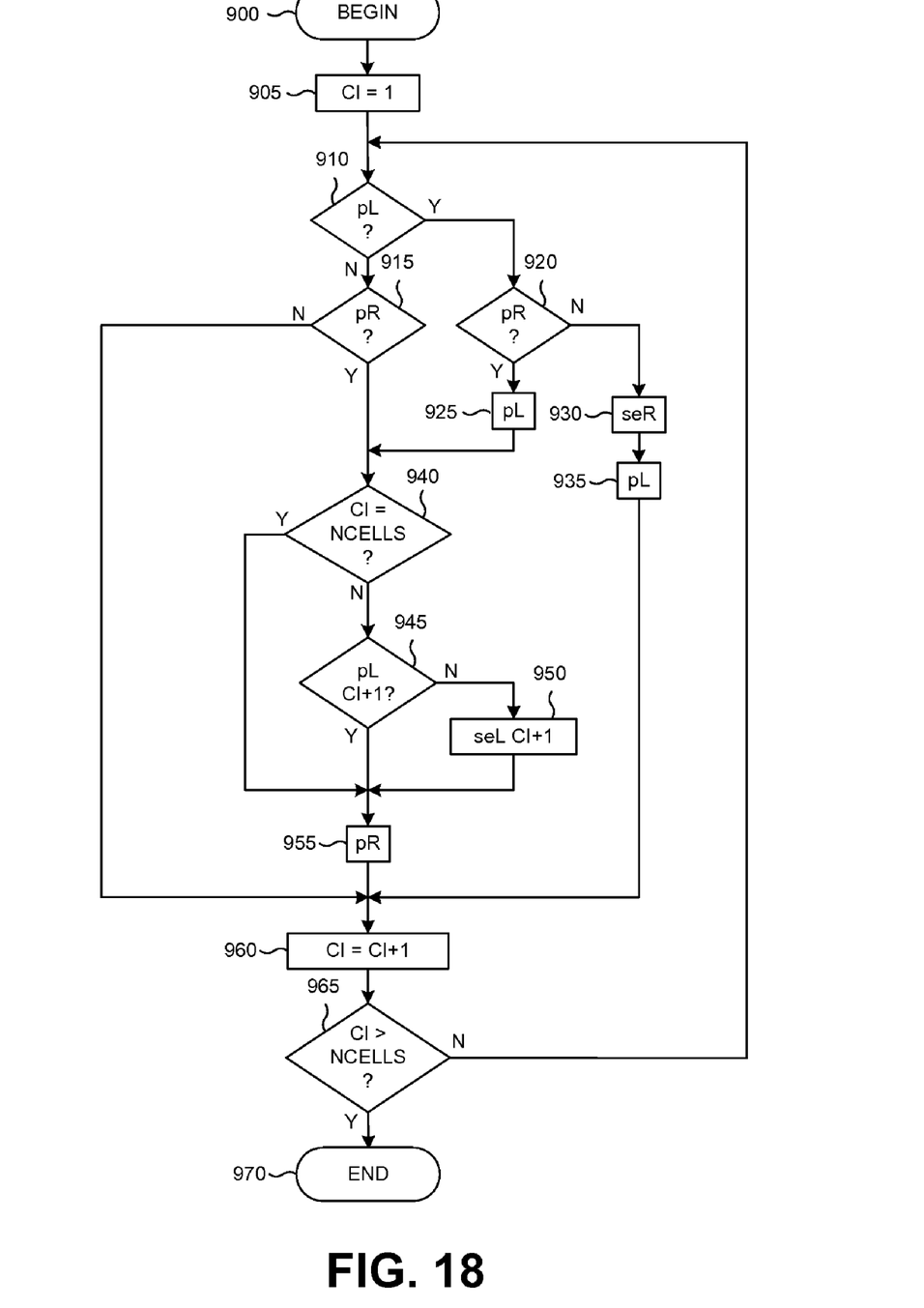
FIG. 18 is a flow diagram of one implementation of a method of programming a row of charge trapping memory cells.

If, at step 915, the programming instructions specify that the right bit of the identified cell is to be programmed, then a test is performed at step 940 to determine whether a last cell in the identified row has been reached. If so, then the method continues at step 955 as described below. If the last cell has not been reached, then a test is performed at step 945 to determine whether a left bit in a cell that is right adjacent to the identified cell (e.g., charge trapping memory cell 410 in FIG. 8) is to be programmed. If the left bit in the right-adjacent cell is not to be programmed, then the left bit in the right-adjacent cell is erased at step 950 using one of the erase and selective erase methods already described, and the method continues at step 955. If, at step 945, the left bit in the right-adjacent cell is to be programmed, then the method continues at step 955 by programming the right bit of the identified cell. The method then continues at step 960 as described below.

If, at step 910, the programming instructions specify that the left bit of the identified cell is to be programmed, then the method continues at step 920 by determining whether the right bit of the identified cell is to be programmed. If the right bit of the identified cell is not to be programmed, then the right bit of the identified cell is erased at step 930 using, for example, the method described above with reference to FIG. 5. Alternatively, the erase step 930 may be a selective erase as described above with reference to FIG. 14. The left bit of the identified cell then may be programmed at step 935 using, for example, the method described above with reference to FIG. 4, after which the method may continue at step 960 as described below.

If, at step 920, the programming instructions specify that the right bit of the identified cell is to be programmed, then the left bit of the identified cell is programmed at step 925, and the method returns to step 940 described above.

At step 960, the cell index CI is incremented, and a test is performed at step 965 to determine whether the last cell in the identified row has been reached. If the last cell has not been reached, then the method returns to step 910 described above. If the last cell has been reached, then the method may be terminates at step 970.

The implementation described above with reference to FIG. 18 may apply in situations where the presence or absence of the second bit effect and/or program disturbance is known before programming takes place. In such situations, selective erasing can be performed either before or after programming. In other situations, selective erasing may be performed in order to achieve a specified programming window. For example, with reference to FIG. 11, in a case where bit A 510 is to be erased and bit B 515 is to be programmed, bit B 515 may first be programmed, and then the $V_t$ of bit A 510 may be measured. According to a measured shift in the $V_t$ of bit A 510, a selective erase may or may not be required. When, for example, a 2.5 V operation window is specified, programming bit B 515 to a level of 3 V may introduce a 1 V shift in the $V_t$ of bit A 510 so that a selective erase of bit A 510 would be required to increase the programming window from 2 V to at least 2.5 V.

According to another example, programming bit B 515 to a level of 3 V may produce a 0.6 V program disturbance to bit C 520. Additionally, if, for example, bit D 525 is programmed with a $\Delta V_t$ of, say, 3 V, then the operation window would be 3−0.6=2.4 V so that a selective erase of bit C would be required. Moreover, programming bit D to a $\Delta V_t$ of 3 V may cause a second bit effect to bit C making the total shift in the $V_t$ of bit C about 1.6 V, reducing the operation window to 1.4 V. Such a reduction in operating window could be corrected by performing a selective erase of bit C 520. In another instance, programming bit D 525 to 3 V may result in a $\Delta V_t$ shift of bit C 520 of 0.4 V resulting in an operation window of 3.0−0.4=2.6 V, which is greater than 2.5 V so that a selective erase of bit C 520 would not be necessary. It will be understood that the numbers used in the examples described herein are presented by way of illustration and not by way of limitation.

Figure 19A:
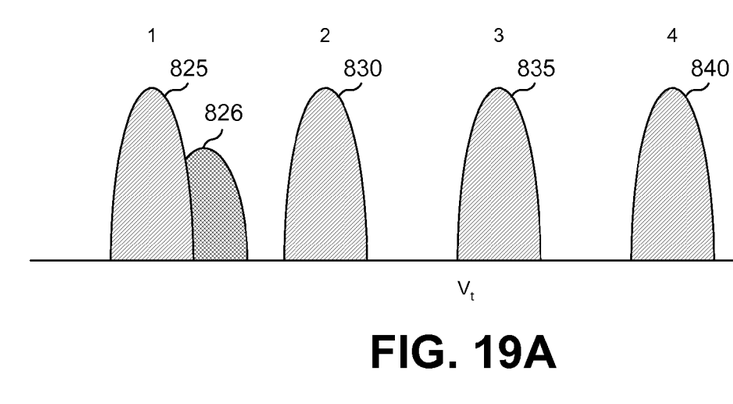
FIGS. 19A and 19B are diagrams illustrating multilevel operation of a charge trapping memory cell.
Figure 19B:
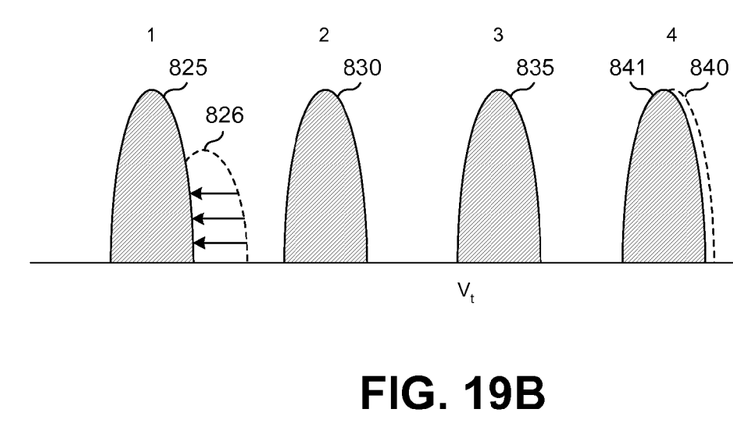

In modified embodiments, each of the left data region and the right data region in a charge trapping memory cell may be capable of storing more than two possible data values. For example, each left data region and each right data region may be capable of being programmed to one of four distinguishable $V_t$ levels, resulting in a capability to store two bits per data region or four bits in a charge trapping memory cell having two data regions. The methods disclosed herein may increase a programming window associated with such multilevel operation by improving an ability to determine whether a data region is unprogrammed or programmed to one of, for example, three distinguishable levels. FIGS. 19A and 19B present a diagram describing how the present methods may improve multilevel operation of charge trapping memory cells. FIG. 19A illustrates four $V_t$ levels 825, 830, 835, and 840 that may be associated with a data region of a charge trapping memory cell corresponding, respectively, to four program states 1, 2, 3, and 4. Programming the data region to a maximum $V_t$ level 840 may undesirably increase a programming level of program state 1, the undesired $V_t$ level being designated as 826 in the figure. By applying methods disclosed herein, the programming level 825 of program state 1 may be substantially restored to its desired value, as illustrated in FIG. 19B, while the programming level 840 of program state 4 may be minimally affected, possibly moving to a slightly reduced programming level 841 (FIG. 19B).

In view of the foregoing, it will be understood by those skilled in the art that the methods of the present invention can facilitate programming of read only memory devices, and in particular read only memory devices exhibiting dual data regions, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method, comprising:
    providing an array of charge trapping memory cells, the array comprising a plurality of rows of charge trapping memory cells;
    identifying a row of the array;
    identifying a first charge trapping memory cell in the identified row, the first charge trapping memory cell having first and second data regions;
    receiving a first programming instruction according to the first and second data regions in the first charge trapping memory cell;
    programming the first data region in the first charge trapping memory cell when the first programming instruction dictates programming of the first data region in the first charge trapping memory cell; and erasing the second data region in the first charge trapping memory cell when the first programming instruction dictates programming of the first data region in the first charge trapping memory cell and when the first programming instruction does not dictate programming of the second data region in the first charge trapping memory cell.

2. The method as set forth in claim 1, wherein the programming of the first data region comprises injecting a charge having a first polarity into the first data region.

3. The method as set forth in claim 2, wherein the injecting of a charge having a first polarity comprises injecting channel hot electrons.

4. The method as set forth in claim 2, wherein the erasing of the second data region comprises injecting a charge having a second polarity into the second data region.

5. The method as set forth in claim 4, wherein the injecting of a charge having a second polarity comprises injecting band-to-band hot holes.

6. The method as set forth in claim 1, wherein the erasing of the second data region in the first charge trapping memory cell is performed before the programming of the first data region in the first charge trapping memory cell.

7. The method as set forth in claim 1, wherein the erasing of the second data region in the first charge trapping memory cell is performed after the programming of the first data region in the first charge trapping memory cell.

8. The method as set forth in claim 1, further comprising:

receiving a second programming instruction according to a second charge trapping memory cell in the identified row of the array, the second charge trapping memory cell having first and second data regions, wherein the first data region of the second charge trapping memory cell shares a bitline with the second data region of the first charge trapping memory cell;

programming the second data region in the first charge trapping memory cell when the first programming instruction dictates programming of the second data region in the first charge trapping memory cell; and erasing the first data region in the second charge trapping memory cell when the first programming instruction dictates programming of the second data region in the first charge trapping memory cell and when the second programming instruction does not dictate programming of the first data region in the second charge trapping memory cell.

9. The method as set forth in claim 8, wherein the erasing of the first data region in the second charge trapping memory cell is performed before the programming of the second data region in the first charge trapping memory cell.

10. The method as set forth in claim 8, wherein the erasing of the first data region in the second charge trapping memory cell is performed after the programming of the second data region in the first charge trapping memory cell.

11. The method as set forth in claim 8, wherein the programming changes a threshold voltage of at least one data region of the first charge trapping memory cell by an amount distinguishable from a threshold voltage of the at least one data region when the first charge trapping memory cell is unprogrammed.

12. The method as set forth in claim 8, wherein the programming changes a threshold voltage of the at least one data region of the first charge trapping memory cell to one of a plurality of levels distinguishable from each other and distinguishable from the threshold voltage of the at least one data region when the first charge trapping memory cell is unprogrammed.

13. The method as set forth in claim 12, wherein the plurality of levels comprises at least two levels.

14. A method, comprising:

providing an array comprising a plurality of rows of charge trapping memory cells;

identifying a row of the array;

identifying a first charge trapping memory cell in the identified row, the first charge trapping memory cell having first and second data regions;

identifying a second charge trapping memory cell in the identified row, the second charge trapping memory cell having a first data region that shares a bitline with the second data region of the first charge trapping memory cell;

receiving a first programming instruction according to the first and second data regions in the first charge trapping memory cell;

receiving a second programming instruction according to the first data region of the second charge trapping memory cell;

programming the second data region in the first charge trapping memory cell when the first programming instruction dictates programming of the second data region in the first charge trapping memory cell; and erasing the first data region in the second charge trapping memory cell when the first programming instruction dictates programming of the second data region in the first charge trapping memory cell and when the second programming instruction does not dictate programming of the first data region in the second charge trapping memory cell.

15. The method as set forth in claim 14, further comprising:

programming the first data region in the first charge trapping memory cell when the first programming instruction dictates programming of the first data region in the first charge trapping memory cell; and erasing the second data region in the first charge trapping memory cell when the first programming instruction dictates programming of the first data region in the first charge trapping memory cell and when the first programming instruction does not dictate programming of the second data region in the first charge trapping memory cell.

16. The method as set forth in claim 14, wherein the erasing comprises selective erasing.

17. The method as set forth in claim 16, wherein the selective erasing comprises erasing a data region of one charge trapping memory cell in the identified row while not affecting substantially a program state of a data region of another charge trapping memory cell, the data region of the other charge trapping memory cell sharing a bitline with the data region of the one charge trapping memory cell.

18. The method as set forth in claim 16, wherein the selective erasing of the first data region in the second charge trapping memory cell comprises:

identifying a first bitline shared by the second data region in the first charge trapping memory cell and the first data region of the second charge trapping memory cell;

identifying a wordline shared by the first and second charge trapping memory cells;

identifying a second bitline associated with the first data region of the first charge trapping memory cell;

identifying a third bitline associated with the second data region of the second charge trapping memory cell;

applying a first potential to the first bitline;

applying a second potential to the second bitline;

applying a third potential to the third bitline; and applying a fourth potential to the wordline, whereby:
- a difference between the first potential and the third potential is sufficient to inject band-to-band hot holes into the first data region of the second charge trapping memory cell; and
- a difference between the first potential and the second potential is not sufficient to inject band-to-band hot holes into the second data region of the first charge trapping memory cell.

19. The method as set forth in claim 18, wherein:
the first, second, third, and fourth potentials are referenced to a substrate potential;
the first potential ranges from about 3.5 volts to about 5.5 volts;
the second potential ranges from about zero volts to about 2 volts;
the third potential is substantially equal to the substrate potential; and
the fourth potential ranges from about −3 volts to about −10 volts.

20. The method as set forth in claim 18, further comprising:
identifying a third charge trapping memory cell that shares a wordline and the second bitline with the first charge trapping memory cell;
identifying a fourth charge trapping memory cell that shares a wordline with the first charge trapping memory cell, the fourth charge trapping memory cell having a fifth bitline and a fourth bitline shared with the third charge trapping memory cell;
applying a fifth potential to the fourth bitline; and
applying a sixth potential to the fifth bitline, whereby:
- a difference between the second potential and the fifth potential is not sufficient to inject band-to-band hot holes into a data region of the third charge trapping memory cell; and
- a difference between the fifth potential and the sixth potential is not sufficient to inject band-to-band hot holes into a data region of the fourth charge trapping memory cell.

21. A nonvolatile memory composed of an array of rows and columns of cells, each cell comprising:
- a substrate region including source and drain regions to which bitlines are connected, the bitlines being shared by cells in a column of the array;
- a charge storage structure having first and second data regions; and
- one or more dielectric structures disposed at least partly between the charge storage structure and the substrate region and at least partly between the charge storage structure and a gate connection, the gate connection being connected to a word line, the word line being shared by cells in a row of the array, wherein an operating window of the cell is increased by selectively erasing the first data region that is to remain erased when the second data region is to be programmed.

22. The nonvolatile memory as set forth in claim 21, wherein the first data region and the second data region are disposed in the same cell.

23. The nonvolatile memory as set forth in claim 21, wherein the first data region is disposed in a first cell and the second data region is disposed in a second cell adjacent to the first cell, the second cell sharing a bitline and a word line with the first cell.

* * * * *